(12) United States Patent
Houssameddine

(10) Patent No.: US 9,293,182 B2
(45) Date of Patent: Mar. 22, 2016

(54) RANDOM ACCESS MEMORY ARCHITECTURE FOR READING BIT STATES

(71) Applicant: Everspin Technologies, Inc., Chandler, AZ (US)

(72) Inventor: Dimitri Houssameddine, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 26 days.

(21) Appl. No.: 13/688,390

(22) Filed: Nov. 29, 2012

(65) Prior Publication Data

US 2013/0155762 A1    Jun. 20, 2013

Related U.S. Application Data

(60) Provisional application No. 61/576,197, filed on Dec. 15, 2011.

(51) Int. Cl.
*G11C 11/16* (2006.01)

(52) U.S. Cl.
CPC ............ *G11C 11/16* (2013.01); *G11C 11/1675* (2013.01)

(58) Field of Classification Search
CPC ......... G11C 11/16; G11C 11/22; H01L 43/08
USPC ............................ 365/158, 148, 97, 171, 150
See application file for complete search history.

(56) References Cited

U.S. PATENT DOCUMENTS

| | | | |
|---|---|---|---|
| 6,925,002 B2 | 8/2005 | Schwarzl | |
| 7,872,905 B2 | 1/2011 | Marino et al. | |
| 8,058,696 B2 | 11/2011 | Ranjan et al. | |
| 8,264,895 B2 * | 9/2012 | Rao | G11C 11/16 365/148 |
| 2003/0090934 A1 | 5/2003 | Iwata | |
| 2004/0218441 A1 * | 11/2004 | Schwarzl | G11C 11/16 365/202 |
| 2004/0257855 A1 * | 12/2004 | Hilton | G11C 11/16 365/150 |
| 2007/0047294 A1 * | 3/2007 | Panchula | B82Y 25/00 365/158 |
| 2007/0195585 A1 | 8/2007 | Sakimura et al. | |
| 2009/0116310 A1 | 5/2009 | Florez Marino et al. | |
| 2010/0023287 A1 * | 1/2010 | Worledge et al. | 702/65 |
| 2010/0091546 A1 * | 4/2010 | Liu et al. | 365/97 |
| 2010/0109660 A1 * | 5/2010 | Wang et al. | 324/244 |
| 2010/0164487 A1 | 7/2010 | Eyckmans et al. | |
| 2010/0177557 A1 * | 7/2010 | Liu et al. | 365/158 |
| 2011/0007561 A1 * | 1/2011 | Berger | G11C 11/16 365/171 |
| 2011/0058408 A1 | 3/2011 | Meng et al. | |
| 2011/0128771 A1 | 6/2011 | Rao | |

(Continued)

FOREIGN PATENT DOCUMENTS

EP    2 212 885 A2    8/2010

OTHER PUBLICATIONS

PCT Search Report and Written Opinion mailed Feb. 25, 2013 in PCT/US12/69818.

(Continued)

*Primary Examiner* — Shawki S Ismail
*Assistant Examiner* — Muhammad Islam

(57) ABSTRACT

An architecture and method includes providing an oscillatory signal through each magnetic tunnel junction (MTJ), or in a line adjacent each MTJ, in a magnetoresistive random access memory array. A rectified signal appearing across each MTJ is measured and compared to a reference signal for determining the state of the MTJ.

20 Claims, 2 Drawing Sheets

(56) References Cited

U.S. PATENT DOCUMENTS

| | | | |
|---|---|---|---|
| 2011/0292714 A1* | 12/2011 | Andre et al. | 365/148 |
| 2012/0057400 A1* | 3/2012 | Kim et al. | 365/158 |
| 2012/0120708 A1* | 5/2012 | Jin et al. | 365/145 |
| 2012/0155157 A1* | 6/2012 | Oh | 365/158 |
| 2012/0201073 A1* | 8/2012 | Berger | G11C 11/16 365/158 |
| 2012/0326712 A1* | 12/2012 | Tudosa et al. | 324/252 |

OTHER PUBLICATIONS

Supplemental European Search Report, dated Jun. 30, 2015 (6 pages).

* cited by examiner

RANDOM ACCESS MEMORY ARCHITECTURE FOR READING BIT STATES

CROSS REFERENCE TO RELATED APPLICATION

This application claims the benefit of U.S. Provisional Application No. 61/576,197 filed 15 Dec. 2011.

FIELD

The present invention generally relates to magnetic random access memory (MRAM) architecture and more particularly to a circuit for determining the state of the bits in a magnetic tunnel junction (MTJ) array.

BACKGROUND

Thin film magnetoresistive random access memory (MRAM), which includes a plurality of magnetic tunnel junction (MTJ) cells, can be fabricated in a variety of memory cell embodiments. The MTJ cell essentially includes a pair of magnetic layers with an insulating layer sandwiched therebetween. One of the magnetic layers has a fixed magnetic vector and the other magnetic layer has a changeable (free) magnetic vector that is stable when either aligned with or opposed to the fixed magnetic vector. When the magnetic vectors are aligned, the resistance of the MTJ cell, i.e. the resistance to current flow between the magnetic layers, is a minimum, Rmin, and when the magnetic vectors are opposed, or misaligned, the resistance of the MTJ cell is a maximum, Rmax. The logic state of the MTJ cell is usually determined by a direct or indirect measurement of its electrical resistance.

Different read schemes have been proposed to determine the logic state of MTJ cells in an MRAM array. In the case of midpoint approaches, a read signal is applied to a given MTJ cell and an electrical property is measured and compared to a reference value in order to determine its logic state. For example, a sense amplifier can be used to measure the current passing through a cell in response to a voltage drop across the MTJ. The reference signal can be set as the midpoint of the current flowing through a reference bit in the low state and a reference bit in the high state.

Process variations, such as dielectric thickness or MTJ size, will cause the resistances Rmin and Rmax to vary within different cells of the array. Midpoint reference read techniques require high magneto-resistance (MR) in order to provide sufficient separation of the Rmin and Rmax distributions to reliably determine the logic state of the cell. Given the resistance and MR distributions measured in MRAM arrays, achieving MR values required for midpoint read approaches can be challenging.

Self-reference techniques have been developed to overcome the shortcomings of midpoint techniques and to provide a reliable way of determining the MTJ cell logic state without requiring high MR. In this case, the resistance of a MTJ cell is first sampled, then the MTJ cell is written to a known state, and finally the resistance of the cell is sampled again and compared to the first value. The comparison of the resistance of the cell before and after the write operation allows determining its logic state. This process is called a destructive read since the initial state of the MTJ cell is lost during the read operation.

Although self-reference techniques provide a better sensitivity than midpoint techniques, they have several disadvantages. The destructive read requires the MTJ cell to be written back to its initial state after the read operation is completed. The write operations involved during the read result in increased power consumption, longer cycle times, and additional stress of the tunnel junction eventually leading to reduced lifetime of the memory.

Accordingly, it is desirable to use an MTJ configuration in a midpoint reference MRAM without requiring a high MR. Furthermore, other desirable features and characteristics of the present invention will become apparent from the subsequent detailed description and the appended claims, taken in conjunction with the accompanying drawings and this background.

BRIEF SUMMARY

An architecture and method are provided for determining a MTJ cell logic state based on the measurement of the rectified electrical signal generated in response to an oscillatory sensing signal.

In an exemplary embodiment, a method of reading a magnetic tunnel junction cell comprises applying an oscillating signal to the magnetic tunnel junction cell; measuring the rectified signal across the magnetic tunnel junction cell; comparing the rectified signal with a reference signal; and determining the state of the magnetic tunnel junction cell based on the comparing step.

In another exemplary embodiment, a random access memory architecture includes a plurality of magnetic memory bits, each magnetic memory bit having a programmable state comprising one of a first resistance state and a second resistance state; a sensing unit configured to apply an oscillating signal to each of the magnetic memory bits; and a read logic selectively coupled to each of the magnetic memory bits and configured to sense whether each magnetic memory bit is in the first or second resistance state.

In yet another exemplary embodiment, a magnetoresistive random access memory includes an array of memory cells, each memory cell having a programmable state consisting of one of a first resistance state and a second resistance state; a sensing unit configured to apply an oscillating signal to each of the memory cells; and a read logic configured to measure a rectified signal across each of the memory cells and compare the rectified signal with a reference signal to determine if the cell is in the first or second resistance state.

BRIEF DESCRIPTION OF THE DRAWINGS

Embodiments of the present invention will hereinafter be described in conjunction with the following drawing figures, wherein like numerals denote like elements.

DETAILED DESCRIPTION

Figure 1:
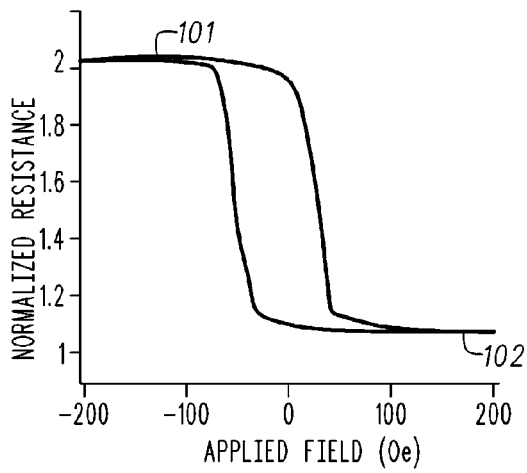
FIG. 1 is a graph of typical normalized resistance of a magnetic bit as a function of applied magnetic field.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

The disclosed read technique involves determining a MTJ cell logic state based on the measurement of the rectified electrical signal generated in response to an oscillatory sensing signal. Rectification effects are observed in a variety of non-linear systems. One of their manifestations is the generation of a time independent signal in response to an oscillating excitation. MTJs are non-linear systems since the resistance of the junction depends on the applied voltage or applied current. An oscillating voltage across the junction will cause its resistance to oscillate at the same frequency. The product of the oscillating resistance and oscillating voltage will give rise to a time independent current. The magnitude of the rectified signal (either a voltage or a current) is directly related to the non-linearity of the device. In the case of MTJs, the resistance dependence with applied voltage shows a strong asymmetry between the low and high states. Therefore, the rectified signal will strongly depend on the MTJ state. In some cases, the relative variation in the rectified signal can greatly exceed the device magneto-resistance.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

The traditional MRAM switching technique, using magnetic fields generated by current-carrying lines adjacent to the memory element has some practical limitations, particularly when the design calls for scaling the bit cell to smaller dimensions. For example, decreasing the physical size of the MTJ elements results in lower stability against unwanted magnetization reversal due to thermal fluctuations, because the energy barrier to thermal reversal decreases with decreasing free layer volume.

A spin torque magnetoresistive random access memory (ST-MRAM) array includes write current drivers and sense-amplifiers positioned near a plurality of magnetoresistive bits. A write, or program, operation begins when a current of either one of the two different and opposite polarities is applied through the magnetic storage element, e.g., MTJ. A spin transfer torque (STT) current is applied to selected ones of the magnetoresistive bits to switch the selected bit to the desired programmed state.

Briefly, a current becomes spin-polarized after the electrons pass through the first magnetic layer in a magnet/non-magnet/magnet trilayer structure, where the first magnetic layer is substantially fixed in its magnetic orientation by any one of a number of methods known in the art. The spin-polarized electrons cross the nonmagnetic spacer and then, through conservation of spin angular momentum, exert a spin torque on the second magnetic layer, which switches the magnetic orientation of the second layer to be parallel to the magnetic orientation of the first layer. If a current of the opposite polarity is applied, the electrons instead pass first through the second magnetic layer. After crossing the non-magnetic spacer, a spin torque is applied to the first magnetic layer. However, since its magnetization is fixed, the first magnetic layer does not switch. Simultaneously, a fraction of the electrons will then reflect off the first magnetic layer and travel back across the nonmagnetic spacer before interacting with the second magnetic layer. In this case, the spin torque acts so as to switch the magnetic orientation of the second layer to be anti-parallel to the magnetic orientation of the first layer. Spin-torque switching occurs only when the current exceeds the critical current $I_C$ of the element. The spin-torque switching current used by the circuit is chosen to be somewhat above the average $I_C$ of the memory elements so that all elements will switch reliably when the switching current is applied.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

FIG. 1 illustrates the magneto-resistance curve of a typical MTJ cell having an external magnetic field switch the cell logic state. A typical magnetic tunnel junction used for MRAM arrays has a tunnel magneto-resistance (TMR) of about 100%, meaning that the resistance in the high state 101 is about twice the resistance in the low state 102.

Figure 2:
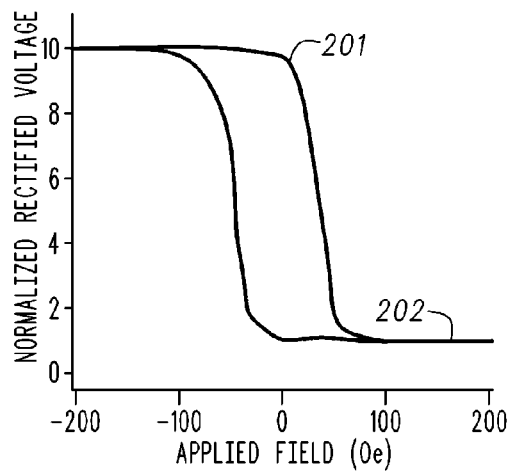
FIG. 2 is a graph of normalized rectified voltage of a magnetic bit subjected to a microwave current as a function of applied magnetic field in accordance with the exemplary embodiments.

FIG. 2 illustrates the rectified voltage measured across the same MTJ cell when a microwave current is passed through the cell in accordance with one exemplary embodiment. An external magnetic field was used to switch the cell logic state. The amplitude of the rectified voltage is about ten times higher in the high state 201 than in the low state 202.

Using rectified signals for determining a MTJ cell logic state can enable a midpoint read approach without requiring high MR. The read operation comprises submitting the MTJ cell to an oscillatory excitation signal, measuring the rectified signal generated, and comparing the rectified signal to a reference.

In a first exemplary embodiment, the sensing signal is an oscillatory voltage applied to the MTJ. The rectified current generated in response to the sensing signal is used to determine the MTJ cell state. For a spin-torque MRAM array, the oscillatory signal preferably has a low magnitude in order to prevent read disturbs of the bits. The duration of the oscillatory signal is longer than the oscillatory period, preferably at least 2 or 3 times the period to allow the rectified signal to settle on a magnitude. In order to achieve fast read operation, typically less than 10 ns, the oscillatory signal frequency is preferably in the GHz range.

Figure 3:
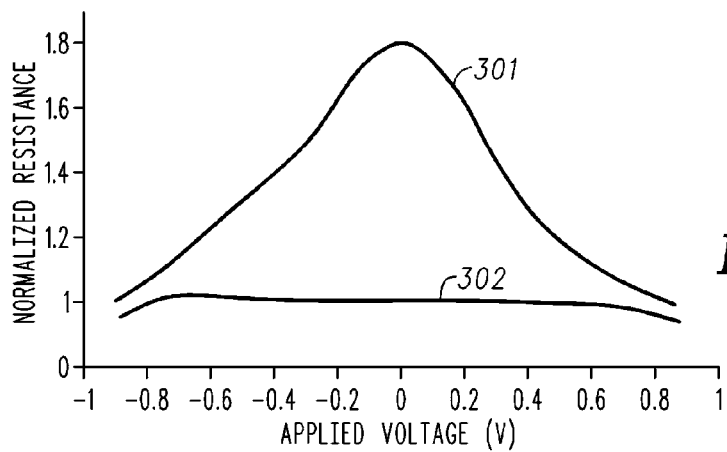
FIG. 3 is a graph of normalized resistance of a magnetic bit as a function of an applied voltage pulse of 100 ns while a strong external magnetic field maintained the bit in a given state.

In accordance with the exemplary embodiments, FIG. 3 shows the MTJ resistance dependence with applied voltage, in the high state 301 and the low state 302. The device non-linearity changes significantly in the high state but remains small in the low state. The rectified signal asymmetry can be improved by applying a DC bias voltage to the MTJ. The bias voltage is preferably chosen to be small in order to avoid read disturbs. The bias voltage sets the operating point in the slope of the high resistance state characteristics and its polarity is chosen to maximize the slope.

The variation in rectified signal amplitude with the MTJ cell resistance state can be optimized by matching the sensing signal frequency with the ferromagnetic resonance of the MTJ. Magnetic tunnel junctions are resonant systems and can show multiple resonance peaks. The resonance of the uniform mode is called ferromagnetic resonance (FMR). The magnitude of the rectified signal is enhanced when the frequency of the oscillatory excitation is chosen to be at the MTJ resonance. The frequency of the MTJ resonance depends on the internal magnetic field and therefore can be state-dependent. For example, in the presence of interlayer coupling through the tunnel barrier, the internal magnetic field acting on the free layer is different in the high and low states. Since the high state exhibits stronger non-linearity than the low state, it is preferable to match the oscillatory signal frequency with the high state resonance frequency and thus enhance the variation of the read rectified signal with MTJ state.

Figure 4:
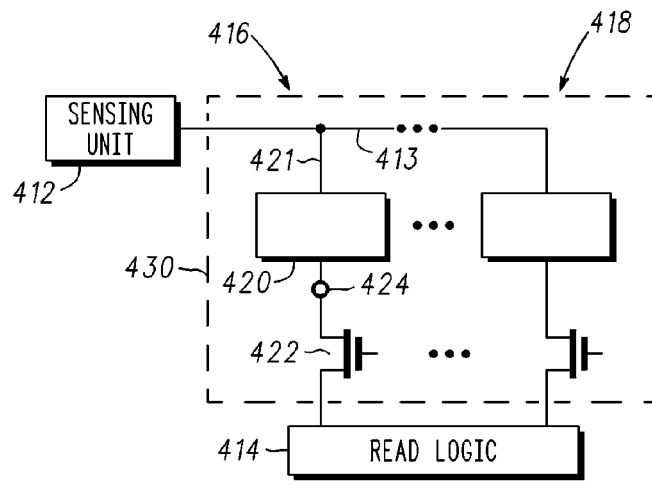
FIG. 4 is a schematic diagram of circuitry for reading a magnetic bit of an array in accordance with a first exemplary embodiment.

Referring to FIG. 4 and in accordance with the first exemplary embodiment, an MRAM array 430 is coupled to the sensing unit 412 and read logic 414. The sensing unit 412 generates an oscillating signal, and may, in some embodiments, also generate a DC bias signal. The array 430 includes a plurality of columns 416, 418, each including a plurality of magnetic bits 420. One of a plurality of select transistors 422 is coupled to each column 416, 418 at node 424 and to the read logic 414.

In operation, an oscillatory signal is sent through the magnetic bit 420 from the sensing unit 412 via conductors 413, 421. Due to rectification effects, a DC signal is generated across the tunnel junction of the magnetic bit 420. The magnitude of this rectified signal is dependent on the non-linearity of the magnetic bit 420. Since the magnetic bit 420 resistance non-linearity in the high state is much greater than in the low state, the signal in the high state is much greater than the signal in the low state. The rectified signal measured is compared to a reference signal to determine the state (high or low) of the magnetic bit. The rectified signal can be measured as a voltage across the magnetic bit 420 at conductor 421 and node 424, or as a current through the memory cell 420, respectively.

In a second exemplary embodiment, an oscillatory current is passed through a metal line adjacent to the MTJ. The current induces an electromagnetic field that couples to the magnetization of the MTJ free layer and generates a rectified signal across the MTJ. The field line is preferably close to the bits to minimize the power required for the oscillatory signal. The field line may be formed adjacent to a plurality of bits, allowing for reading of the bits in parallel. As in the first exemplary embodiment, the duration of the oscillatory signal is longer than the oscillatory period, preferably at least 2 or 3 times the period to allow the rectified signal to settle on a magnitude. Further optimizations of the rectified signal amplitude by applying a DC bias to the MTJ or matching the oscillatory signal frequency to the MTJ resonance frequency may also be used with this second exemplary embodiment.

In accordance with the second exemplary embodiment, an MRAM array 530 (FIG. 5) is coupled to a sensing unit 512 and read logic 514. The sensing unit 512 generates an oscillating signal. The array 530 includes a plurality of columns 516, 518, each including a plurality of magnetic bits 520. One of a plurality of select transistors 522 is coupled between each column 516, 518 at node 524 and the read logic 514.

In operation, an oscillatory signal is sent through a conductive line 532 adjacent each magnetic bit 520 from the sensing unit 512. Due to rectification effects, a DC signal is generated across the tunnel junction. The magnitude of the rectified signal is dependent on the non-linearity of the magnetic bit 520. Since the magnetic bit 520 resistance non-linearity in the high state is much greater than in the low state, the signal in the high state is much greater than the signal in the low state. The rectified signal measured is compared to a reference signal to determine the state (high or low) of the magnetic bit. The rectified signal can be measured as a voltage across the magnetic bit 520 at conductor 521 and node 524, or as a current through the memory cell 520, respectively.

The reference signal used to determine the bit (memory cell) state can be a midpoint from rectified signals measured on an assembly of reference bits set in high and low states. It could also be an arbitrary signal, voltage or current, that would not require the use of reference bits.

Each of the exemplary embodiments can be used for field-switched MRAM or ST-MRAM arrays.

Figure 5:
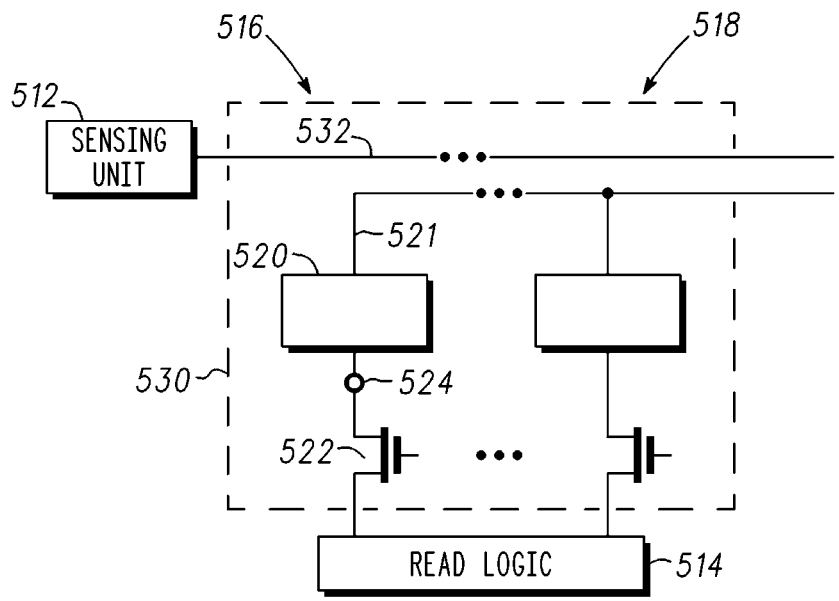
FIG. 5 is a schematic diagram of circuitry for reading a magnetic bit of an array in accordance with a second exemplary embodiment.

In both of the described embodiments of FIGS. 4 and 5, the amplitude of the oscillating signal preferably is kept low. In the case where the sensing signal is a current passing through the magnetic bit (FIG. 4), the amplitude of the current needs to be kept substantially lower than the average switching current of the magnetic bits to avoid read disturbs. In the case where the sensing signal is a magnetic field generated by passing a current through a metal line adjacent to the magnetic bit (FIG. 5), the amplitude of the magnetic field needs to be kept substantially lower than the average switching field of the magnetic bits to avoid read disturbs. The duration of the oscillatory signal is longer than the oscillatory period, preferably at least 2 or 3 times the period, to allow the rectified signal to settle on a magnitude.

In another exemplary embodiment, the rectified signal asymmetry may be improved by applying a small bias voltage or current to the MTJ. The bias sets the operating point in the slope of the high resistance state characteristic, and preferably is small in order to avoid read disturbs. The bias polarity is chosen to maximize the non-linearity asymmetry between the high and low states.

In yet another exemplary embodiment, the resonant nature of magnetic tunnel junctions may be used to enhance the rectified signal. When the input signal frequency matches the MTJ's ferromagnetic resonance, the amplitude of the rectified signal can be improved by an order of magnitude or more. For MTJs with different ferromagnetic resonances in the high and low states, for example, resulting from interlayer coupling, the frequency of the input signal could be adjusted to match the ferromagnetic resonance in the high state. This adjustment would further improve the rectified signal asymmetry and, therefore, the read sensitivity.

Figure 6:
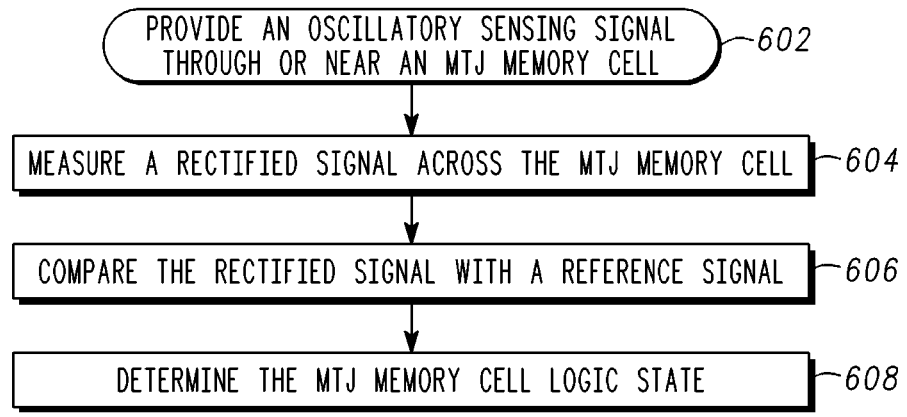
FIG. 6 is a flow chart of the steps for determining the state of a magnetic bit in accordance with the exemplary embodiments.

Referring to FIG. 6, a method 600 of reading an MTJ memory cell in accordance with the exemplary embodiments includes providing 602 an oscillatory signal through or near the MTJ and measuring 604 a rectified signal across the MTJ. The rectified signal is compared 606 to a reference signal for determining 608 the memory cell logic state.

Therefore, providing an oscillatory signal through or near a magnetic tunnel junction bit generates a rectified signal across the bit that is easily compared with a reference signal for determining the state of the bit. The midpoint reference accurately assesses the state of a single MTJ in a plurality of MTJs.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method of reading a data state stored in a magnetic tunnel junction cell, the method comprising:
    applying an oscillating signal to the magnetic tunnel junction cell to read the data state stored therein, wherein applying the oscillating signal includes applying an oscillating voltage across the magnetic tunnel junction cell that causes an oscillating resistance of the magnetic tunnel junction cell, wherein the oscillating resistance of the magnetic tunnel junction cell has a same frequency of oscillation as the oscillating voltage;
    measuring a time-independent DC signal across the magnetic tunnel junction cell while applying the oscillating signal to the magnetic tunnel junction cell, the time-independent DC signal being generated by the magnetic tunnel junction cell in response to applying the oscillating signal to the magnetic tunnel junction cell, wherein the time-independent DC signal is a product of the oscillating resistance of the magnetic tunnel junction cell and the oscillating voltage; and
    determining the data state stored in the magnetic tunnel junction cell by comparing the time-independent DC signal to a reference signal.

2. The method of claim 1 wherein applying the oscillating signal to the magnetic tunnel junction cell further includes applying the oscillating signal through the magnetic tunnel junction cell.

3. The method of claim 1 further comprising:
    causing a frequency of the oscillating signal to match a resonance frequency of the magnetic tunnel junction cell when in one of a high state or a low state.

4. The method of claim 1 further comprising:
    applying an additional bias signal to the magnetic tunnel junction cell to increase a resistance non-linearity.

5. The method of claim 1 wherein applying the oscillating signal to the magnetic tunnel junction cell further includes applying the oscillating signal through a conductive line located near the magnetic tunnel junction cell.

6. The method of claim 2 wherein the oscillating signal comprises a current having an amplitude substantially lower than an average switching current of the magnetic tunnel junction cell.

7. The method of claim 5 wherein applying the oscillating signal comprises applying a magnetic field having an amplitude substantially lower than an average switching field of a plurality of magnetic tunnel junction cells.

8. A random access memory comprising:
    a magnetic memory bit having a programmable state comprising one of a first resistance state and a second resistance state;
    a sensing unit configured to apply an oscillating signal to the magnetic memory bit, wherein applying the oscillating signal includes applying an oscillating voltage across the magnetic memory bit that causes an oscillating resistance of the magnetic memory bit, wherein the oscillating resistance of the magnetic memory bit has a same frequency of oscillation as the oscillating voltage; and
    read logic selectively coupled the magnetic memory bit to read the programmable state stored in the magnetic memory bit, the read logic including circuitry configured to measure one of a current through the magnetic memory bit or a voltage across the magnetic memory bit generated in response to and while applying the oscillating signal to the magnetic memory bit, the read logic configured to determine whether the magnetic memory bit is in the first resistance state or the second resistance state by:
        sensing a time-independent DC signal generated by the magnetic memory bit while the sensing unit applies the oscillating signal to the magnetic memory bit, wherein the time-independent DC signal is a product of the oscillating resistance of the magnetic memory bit and the oscillating voltage; and comparing the time-independent DC signal to a reference signal.

9. The random access memory of claim 8 further comprising:

circuitry configured to measure one of a current through the magnetic memory bit or a voltage across the magnetic memory bit generated in response to and while applying the oscillating signal through a conductive line adjacent to the magnetic memory bit.

10. The random access memory of claim 8 wherein the sensing unit is configured to apply the oscillating signal with a frequency matching the resonance frequency of the magnetic memory bit in one of a high state or a low state.

11. The random access memory of claim 8 wherein the sensing unit is configured to apply a bias signal to the magnetic memory bit to increase a resistance non-linearity.

12. The random access memory of claim 8 wherein the oscillating signal comprises a current having an amplitude substantially lower than an average switching current of a plurality of magnetic memory bits.

13. The random access memory of claim 8 wherein the oscillating signal comprises a magnetic field and the amplitude of the magnetic field is substantially lower than an average switching field of a plurality of magnetic memory bits.

14. A magnetoresistive random access memory comprising:

an array of memory cells, each memory cell includes a magnetic tunnel junction to store a programmable state including a first resistance state or a second resistance state;

a sensing unit electrically coupled to a plurality of memory cells of the array of memory cells and configured to apply an oscillating signal to each of the plurality of memory cells, wherein applying the oscillating signal to each of the plurality of memory cells includes applying an oscillating voltage across the memory cell that causes an oscillating resistance of the memory cell, wherein the oscillating resistance of the memory cell has a same frequency of oscillation as the oscillating voltage; and read logic electrically coupled to the array of memory cells and configured to read the programmable state stored in the magnetic tunnel junction of each memory cell of the plurality of memory cells, wherein the read logic is configured to, for each memory cell of the plurality of memory cells:

(i) measure a time-independent DC signal generated by the magnetic tunnel junction of the memory cell while the sensing unit applies the oscillating signal to the magnetic tunnel junction, wherein the time-independent DC signal is a product of the oscillating resistance of the memory cell and the oscillating voltage; and (ii) compare the time-independent DC signal with a reference signal to determine if the memory cell is in the first resistance state or the second resistance state.

15. The magnetoresistive random access memory of claim 14 further comprising:

circuitry configured to measure, for each memory cell of the plurality of memory cells, one of a current through the magnetic tunnel junction of the memory cell or a voltage across the magnetic tunnel junction of the memory cell while applying the oscillating signal to the magnetic tunnel junction of the memory cell.

16. The magnetoresistive random access memory of claim 14 further comprising:

circuitry configured to measure, for each memory cell of the plurality of memory cells, one of a current through the magnetic tunnel junction of the memory cell or a voltage across the magnetic tunnel junction of the memory cell while applying the oscillating signal through a conductive line adjacent to the memory cell.

17. The magnetoresistive random access memory of claim 14 wherein the sensing unit is configured to apply an oscillating signal with a frequency which matches a resonance frequency of the memory cells in one of a high state or a low state.

18. The magnetoresistive random access memory of claim 14 wherein the sensing unit is configured to apply a bias signal to the magnetic tunnel junction of each of the plurality of memory cells to increase a resistance non-linearity.

19. The magneto resistive random access memory of claim 14 wherein the oscillating signal comprises a current having an amplitude substantially lower than an average switching current of a plurality of magnetic tunnel junctions.

20. The magneto resistive random access memory of claim 14 wherein the oscillating signal comprises a magnetic field having an amplitude substantially lower than an average switching field of a plurality of magnetic tunnel junctions.

* * * * *